United States Patent
Yokomichi

(10) Patent No.: US 7,485,839 B2
(45) Date of Patent: Feb. 3, 2009

(54) IMAGE SENSOR WITH IMAGE SIGNAL SHAPING CIRCUIT

(75) Inventor: Masahiro Yokomichi, Chiba (JP)

(73) Assignee: Seiko Instruments Inc., Chiba (JP)

( * ) Notice: Subject to any disclaimer, the term of this patent is extended or adjusted under 35 U.S.C. 154(b) by 0 days.

(21) Appl. No.: 11/640,634

(22) Filed: Dec. 18, 2006

(65) Prior Publication Data

US 2007/0145244 A1    Jun. 28, 2007

(30) Foreign Application Priority Data

Dec. 19, 2005    (JP) .............................. 2005-364666

(51) Int. Cl.
*H01L 27/00* (2006.01)

(52) U.S. Cl. .............................. 250/214 R; 250/208.1; 330/308; 348/300

(58) Field of Classification Search ............. 250/214 A, 250/214 R, 208.1; 348/300–302, 308; 330/308
See application file for complete search history.

(56) References Cited

U.S. PATENT DOCUMENTS

| | | | | |
|---|---|---|---|---|
| 3,946,151 A | * | 3/1976 | Kamiyama et al. | 348/241 |
| 4,045,817 A | * | 8/1977 | Nakatani et al. | 348/304 |
| 4,067,046 A | * | 1/1978 | Nakatani et al. | 348/308 |
| 4,574,309 A | * | 3/1986 | Arisawa et al. | 348/296 |
| 4,603,355 A | * | 7/1986 | Yamada et al. | 348/305 |
| 5,109,440 A | | 4/1992 | Kawahara et al. | |
| 6,466,265 B1 | * | 10/2002 | Lee et al. | 348/308 |
| 6,538,246 B2 | * | 3/2003 | Wada et al. | 250/214 SW |
| 6,590,455 B1 | * | 7/2003 | Kobayashi | 330/308 |
| 7,045,752 B2 | * | 5/2006 | Posamentier et al. | 250/205 |

* cited by examiner

*Primary Examiner*—Stephen Yam
(74) *Attorney, Agent, or Firm*—Brinks Hofer Gilson & Lione

(57) ABSTRACT

The present invention provides an image sensor capable of making waveforms of image signals, which are outputs from photoelectric converting elements, flat, and capable of acquiring image information in high precision. The image sensor includes: a plurality of photoelectric converting elements; a plurality of selecting switches provided in correspondence with the photoelectric converting elements; a scanning circuit for ON/OFF-controlling the selecting switches; a differential amplifier for amplifying a difference voltage between an electric signal entered from the photoelectric converting elements and a reference voltage; and a resistor electrically connected to two input terminals of the differential amplifier.

13 Claims, 8 Drawing Sheets

IMAGE SENSOR WITH IMAGE SIGNAL SHAPING CIRCUIT

This application claims priority under 35 U.S.C. § 119 to Japanese Patent Application No. JP2005-364666 filed Dec. 19, 2005, the entire content of which is hereby incorporated by reference.

BACKGROUND OF THE INVENTION

1. Field of the Invention

The present invention relates an apparatus for inputting thereinto image information, and more specifically, to an image sensor for converting optical image information into an electric signal.

2. Description of the Related Art

Known examples of conventional image sensors include an image sensor having a structure of FIG. 8, which is disclosed in JP-A-01-298863. In this image sensor, output terminals of a plurality of photoelectric converting elements 111, 112, ..., 11n, which photoelectrically convert image information into electric signals are connected to input terminals of readout switching elements 121, 122, ... 12n. Control terminals of the respective readout switching elements 121, 122, ... 12n are connected to a scanning circuit array 103, and output terminals of the respective readout switching elements 121, 122, ..., 12n are connected to a first common line 132.

The common line 132 is connected to a first input terminal of a switching element B107, an input terminal of a control circuit 106 is connected to a control terminal of the switching element B107, and an output terminal of the switching element B107 is connected to an image signal output terminal 102.

In the scanning circuit array 103, "n" stages of flip-flops are connected to each other in series so as to be arranged as a shift register, and the readout switching elements 121, 122, ..., 12n are sequentially brought into ON states in response to pulses which are entered from an operating pulse input terminal 109 in a time sequential manner.

As a result, photoelectrically-converted image signals which are inputted from the photoelectric converting elements 111, 112, ..., 11n are sequentially synchronized with the pulses and outputted via the switching element B107 from the image signal output terminal 102.

However, as shown in the structure described in the above-described conventional technique, in the case where output signals of the photoelectric converting elements 111, 112, ..., 11n are directly read out, as represented by "Y" in the drawing, electric charges stored in the photoelectric converting elements 111, 112, ..., 11n by illuminated light amounts (corresponding to brightness levels) are discharged by the switching element B107, and discharged waveforms (image signals) from the photoelectric converting elements 111, 112, ..., 11n are rounded due to wiring capacitances present on a mounting board, or load capacitances of externally-connected circuits, so these discharge waveforms become triangular shapes.

As a consequence, the above-explained image sensor owns a drawback in that while the image sensor cannot acquire the waveforms as flat waveforms, for example, even when signals have the same brightness levels, potentials at vertexes of triangular waves are fluctuated, so the above-described conventional image sensor cannot acquire the signal waveforms in high precision.

SUMMARY OF THE INVENTION

The present invention has been made in view of the above-mentioned circumstances, and therefore, has an object to provide an image sensor capable of making waveforms of image signals, which are outputs from photoelectric converting elements, flat, and capable of acquiring image information in high precision.

According to an aspect of the present invention, there is provided an image sensor including: a plurality of photoelectric converting elements for photoelectrically converting inputted optical signals into electric signals having voltages corresponding to brightness levels thereof; a plurality of selecting switches provided in correspondence with the photoelectric converting elements, for turning ON/OFF paths between output portions of the respective photoelectric converting elements for the electric signals and a common output line; a scanning circuit for sequentially ON/OFF-controlling the selecting switches in response to an entered pulse; a differential amplifier for amplifying a difference voltage between the electric signal entered from one input terminal thereof and a reference voltage entered from the other input terminal thereof; and a resistor, one end of which is connected to one input terminal of the differential amplifier to which the electric signal is entered, the reference voltage being entered to the other end of the resistor.

In an image sensor according to another aspect of the present invention, in the differential amplifier, a potential at one input terminal thereof is increased based upon a difference between an amount of currents supplied from the selecting switches and an amount of an current flowing through the resistor.

In an image sensor according to another aspect of the present invention, a resistance value of the resistor is set in correspondence with the inputted light amount.

In an image sensor according to another aspect of the present invention, the resistor is constituted by connecting a plurality of resistors in series, and a resistance value is adjusted by determining as to whether or not a path between the plurality of resistors is short-circuited.

In an image sensor according to another aspect of the present invention, the photoelectric converting elements, the selecting switches, the differential amplifier, and the scanning circuit are formed on the same substrate in an integrated manner.

In an image sensor according to another aspect of the present invention, in the case where a plurality of sets of the image sensors are connected to each other in a cascade manner for use, in order to use the differential amplifier of any one of the image sensors, the scanning circuit is arranged by a plurality of shift registers which can be connected in a cascade manner; a terminal is provided so as to commonly use the common output line; and one input terminal of the differential amplifier is provided as an external terminal.

As described above, according to the present invention, a portion of the electric charges may flow into the reference potential by the resistor, while all of these electric charges are stored in the conventional image sensor. As a result, since the portion of the triangular waveform is not stored, the changing angle may be suppressed, so the triangular waveform is approximated to a flat condition. Accordingly, since the fluctuations caused by the element and the peripheral condition may be suppressed, the S/N ratio may be increased, so the image signal can be acquired in high precision.

According to the present invention, since the electric signal is divided by both the impedance of the selecting switch and the resistance value of the resistor, the S/N ratio can be improved at a desirable sensitivity by adjusting the resistance value of the resistor to be in correspondence with a subject for acquiring an image, namely, to be a brightness level of the subject and an acquisition speed.

Also, according to the present invention, since the resistor is provided between the reference potential and the terminal to which the electric signal to be measured by the differential amplifier is inputted, the signal line of the electric signal is continuously kept in a condition reset to the reference voltage (also under such a condition that electric signal is not outputted), and there is no potential variation caused by externally supplied noise until the electric signal is outputted. As a result, the electric signal can be measured in higher precision.

DESCRIPTION OF THE PREFERRED EMBODIMENTS

First Embodiment

Figure 1:
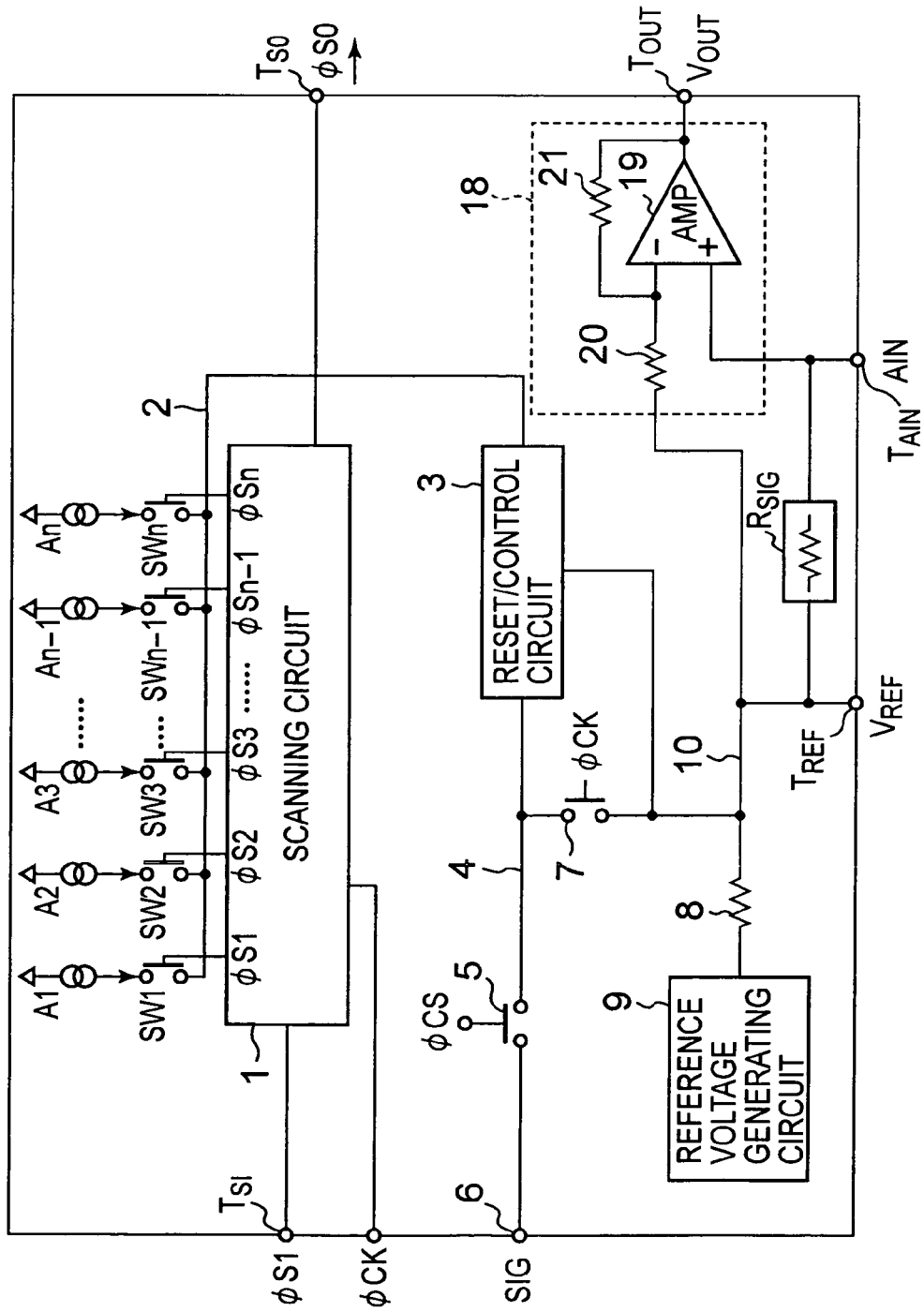
FIG. 1 is a block diagram for showing a structural example of an image sensor according to a first embodiment of the present invention.

Referring to the drawings, a description is made of an image sensor according to a first embodiment of the present invention. FIG. 1 is a block diagram for indicating a structural example as to a semiconductor circuit of the image sensor according to the first embodiment.

In other words, the image sensor shown in FIG. 1 owns a plurality of photoelectric converting elements (for example, A1, A2, A3, . . . , An−1, and An) which photoelectrically convert inputted optical signals into electric signals having voltages corresponding to brightness levels of the optical signals. Also, in the image sensor, selecting switches SW1, SW2, SW3, . . . , SWn−1, and SWn are provided in correspondence with these photoelectric converting elements A1, A2, A3, . . . , An−1, and An, for turning ON/OFF paths between output portions of the electric signals of the respective photoelectric converting elements A1, A2, A3, . . . , An−1, and An, and a common output line 2. In this case, as the above-explained photoelectric converting elements A1, A2, A3, . . . , An−1, and An, phototransistors (npn type phototransistors), photodiodes, or the like are employed, in which electric charges corresponding to light amounts of illuminated light are generated. Also, each of the selecting switches SW1, SW2, SW3, . . . , SWn−1, and SWn is formed of an MOS transistor (for example, n-channel type MOS transistor), while a drain (one terminal) of the MOS transistor is connected to the output portion of the output signal of the corresponding photoelectric converting element, and a source of the MOS transistor is connected to the common output line 2. When any one of these selecting switches SW1, SW2, SW3, . . . , SWn−1, and SWn is turned ON, the output portion of the photoelectric converting element connected to the selecting switch is electrically connected to the common output line 2. That is, the respective photoelectric converting elements A1, A2, A3, . . . , An−1, and An are interposed between a power supply and one terminal of the selecting switches SW1, SW2, . . . , SW−1, and SWn in series.

A scanning circuit 1 is a shift register formed by connecting flip-flops to each other in series. For instance, a pulse ΦSI which constitutes data to be transferred is inputted from an external terminal TSI of the scanning circuit 1, and the data is transferred in synchronism with a rising edge of a pulse Φck having a predetermined time period, and then, pulses ΦS1, ΦS2, ΦS3, . . . , ΦSn−1, and ΦSn are sequentially outputted. In this case, terminals to which the pulses ΦS1, ΦS2, ΦS3, . . . , ΦSn−1, and ΦSn in the scanning circuit 1 are outputted are connected to gates of the selecting switches SW1, SW2, SW3, . . . , SWn−1, and SWn, respectively. When the corresponding pulses ΦS1, ΦS2, ΦS3, . . . , ΦSn−1, and ΦSn are inputted to the respective selecting switches SW1, SW2, SW3, . . . , SWn−1, and SWn, the selecting switches SW1, SW2, SW3, . . . , SWn−1, and SWn are changed from OFF states to ON states. The selecting switches SW1, SW2, SW3, . . . , SWn−1, and SWn become ON states for a time period during which the pulses ΦS1, ΦS2, ΦS3, . . . , ΦSn−1, and ΦSn are inputted thereto, whereas the selecting switches SW1, SW2, SW3, . . . , SWn−1, and SWn become OFF states for a time period during which the pulses ΦS1, ΦS2, ΦS3, . . . , ΦSn−1, and ΦSn are not inputted. In other words, the scanning circuit 1 sequentially controls turning ON/OFF operations of the selecting switches SW1, SW2, SW3, . . . , SWn−1, and SWn, respectively, based upon the time period of the sequentially entered pulses Φck. Also, when data to be shifted is outputted as the pulse ΦSn, the scanning circuit 1 outputs the data as ΦS0 from an external terminal TS0 at the same time.

A reset and control circuit 3 performs a control operation in such a manner that the common output line 2 is connected to either one of an output line 4 and a reference voltage line 10 in order that both the output line 4 and the reference voltage line 10 are not connected at the same time with respect to the common output line 2. For example, the reset and control circuit 3 connects the common output line 2 to the output line 4 during an "L" level period of the pulse Φck, and connects the common output line 2 to the reference voltage line 10 during an "H" level period of the pulse Φck.

A switch 5 controls as to whether or not the output line 4 is connected to a signal output terminal 6. In this case, for example, the switch 5 becomes an ON state for a time period during which a pulse ΦCS having an "H" level is inputted, and becomes an OFF state for a time period during which no pulse ΦCS is inputted, or a pulse ΦCS having an "L" level is entered.

A switch 7 controls as to whether or not the output line 4 is connected to the reference voltage line 10. In this case, for example, the switch 7 becomes such an ON state that the signal line 4 is connected to the reference voltage line 10 during a time period of an "H" level of a pulse Φck, whereas the switch 7 becomes such an OFF state that the signal line 4 is opened with respect to the reference voltage line 10 during time period of an "L" level of a pulse Φck. The above-mentioned switches 5 and 7 are formed of, for instance, MOS transistors.

A reference voltage generating circuit 9 generates a reference voltage VREF and outputs the generated reference voltage VREF which is compared with a voltage level of an electric signal AIN outputted from any one of the photoelectric converting elements A1, A2, A3, ..., An−1, and An. Also, the reference voltage generating circuit 9 outputs a reference voltage signal having the reference voltage VREF via a resistor 8 from a reference voltage terminal TREF.

A differential amplifier 18 is composed of an operational amplifier 19, a resistor 20, and a resistor 21 which determine an amplification factor thereof. One terminal of the resistor 21 is connected to a "−" side input terminal (the other input terminal of differential amplifier) of the operational amplifier 19, and the other terminal of the resistor 21 is connected to an output terminal of the operational amplifier 19, namely is interposed between the "−" side input terminal and the output terminal. One terminal of the resistor 20 is connected to a "+" side input terminal (one input terminal of differential amplifier) of the operational amplifier 19, and the other terminal thereof is connected to an input terminal TAIN.

One terminal of a resistor RSIG is connected to the "+" side input terminal of the operational amplifier 19, and the other terminal thereof is connected to the reference voltage line 10.

Also, the differential amplifier 18 amplifies a potential difference between the reference voltage VREF and the electric signal AIN inputted from the signal input terminal TAIN in accordance with the amplification factor set by the resistors 20 and 21, and then outputs an amplified electric signal VOUT from an output terminal TOUT.

In this case, a description is made of such an effect that the "+" side input terminal of the operational amplifier 19 is pulled down via the resistor RSIG with respect to the reference voltage VREF.

As an example, the case where an electric signal AIN corresponding to the image information is read from the photoelectric converting element A1, and a difference voltage between the read electric signal AIN and the reference voltage VREF is amplified by the differential amplifier 18.

When the switch SW1 is brought into the ON state, an electric charge stored in a parasitic capacitance of the photoelectric converting element A1, namely a charged voltage is outputted as the electric signal AIN via the common output line 2 and the signal line 4 to the "+" side input terminal of the operational amplifier 19.

Figure 2:
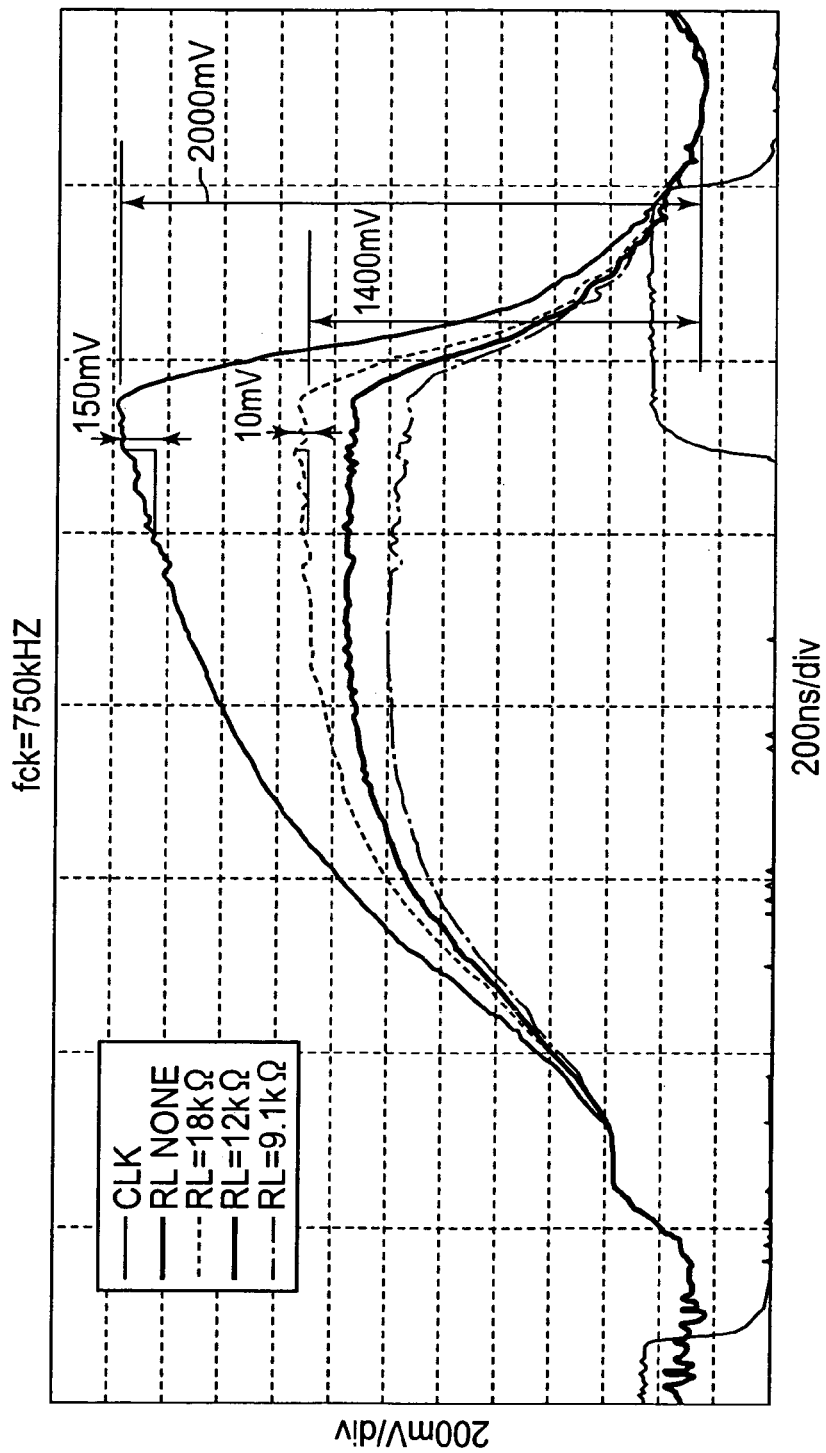
FIG. 2 is a graph for representing measurement results as to changes in potentials of a "+" side input terminal in the case where a resistance value of a resistor GSIG according to the first embodiment (further second embodiment and third embodiment) of the present invention.

At this time, as represented in FIG. 2, the electric charge stored in the photoelectric converting element A1 flows as a current, so a potential at the "+" side input terminal of the operational amplifier 19 starts to gradually increase. FIG. 2 represents a relationship between a time instant (abscissa) and a voltage (ordinate) in such a way that a current value of the resistor RSIG is changed so as to measure a change in the potentials at the "+" side input terminal.

As previously described, a portion of the current produced by the above-explained stored electric charge, namely such a current corresponding to a resistance value of the resistor RSIG flows via the resistor RSIG with respect to the reference voltage line 10.

As a consequence, the potential at the "+" side input terminal of the operational amplifier 19 is increased based upon a difference between the current supplied from the switch SW1 and the current which flows via the resistor RSIG with respect to the reference voltage line 10.

As a result, although the potential at the "+" side input terminal of the operational amplifier 19 increases, an amount of the current flowing through the resistor RSIG increases connection with the increase of the potential, so the increase of the potential may be suppressed, and also, the increase of the potential is lowered as the charged electric charge decreases.

As a consequence, the resistance value of the resistor RSIG is properly set, which is determined based upon a brightness level and a light acquisition time of a sensor (scanning speed of sensor) in correspondence with an amount of light entered to a photoelectric converting element, namely in correspondence with a current supplied from the switch SW1. For example, while the resistance value is changed so as to perform an experiment of the potential change, as indicated in FIG. 2, based upon a maximum value and an intermediate value of light amounts measured under use environment, such a resistance value that both the maximum value and the intermediate value indicate substantially flat changes is set as an optimum value based upon the experiment values.

Accordingly, FIG. 2 shows such a condition that the waveform of the electric signal AIN is made in a flat status as compared with the triangular waveform of the prior art in a time period during which a pulse Φclk is in an "L" level with respect to the "+" side input terminal of the operational amplifier 19, namely the differential amplifier 21 amplifies a difference between the "L" level of the pulse Φclk and the reference voltage VREF, and outputs an output signal VOUT to a circuit of the next stage.

In other words, in FIG. 2, in such a case that the resistor RSIG functioning as a load resistor is not present, an output value is 2000 mV, and a variation of 150 mV per 100 ns is produced. In the case where such a resistor RSIG having a resistance value of 18 kΩ is added, an output value is 1400 mV, and a variation of 10 mV per 100 ns is produced. When the resistor RSIG having the resistance value of 18 kΩ is added, although a sensitivity (dynamic range) is lowered by 30%, since the variation amount is improved to 6.7% (10 mV/150 mV), it can been seen that the entire S/N ratio is improved.

Figure 3:
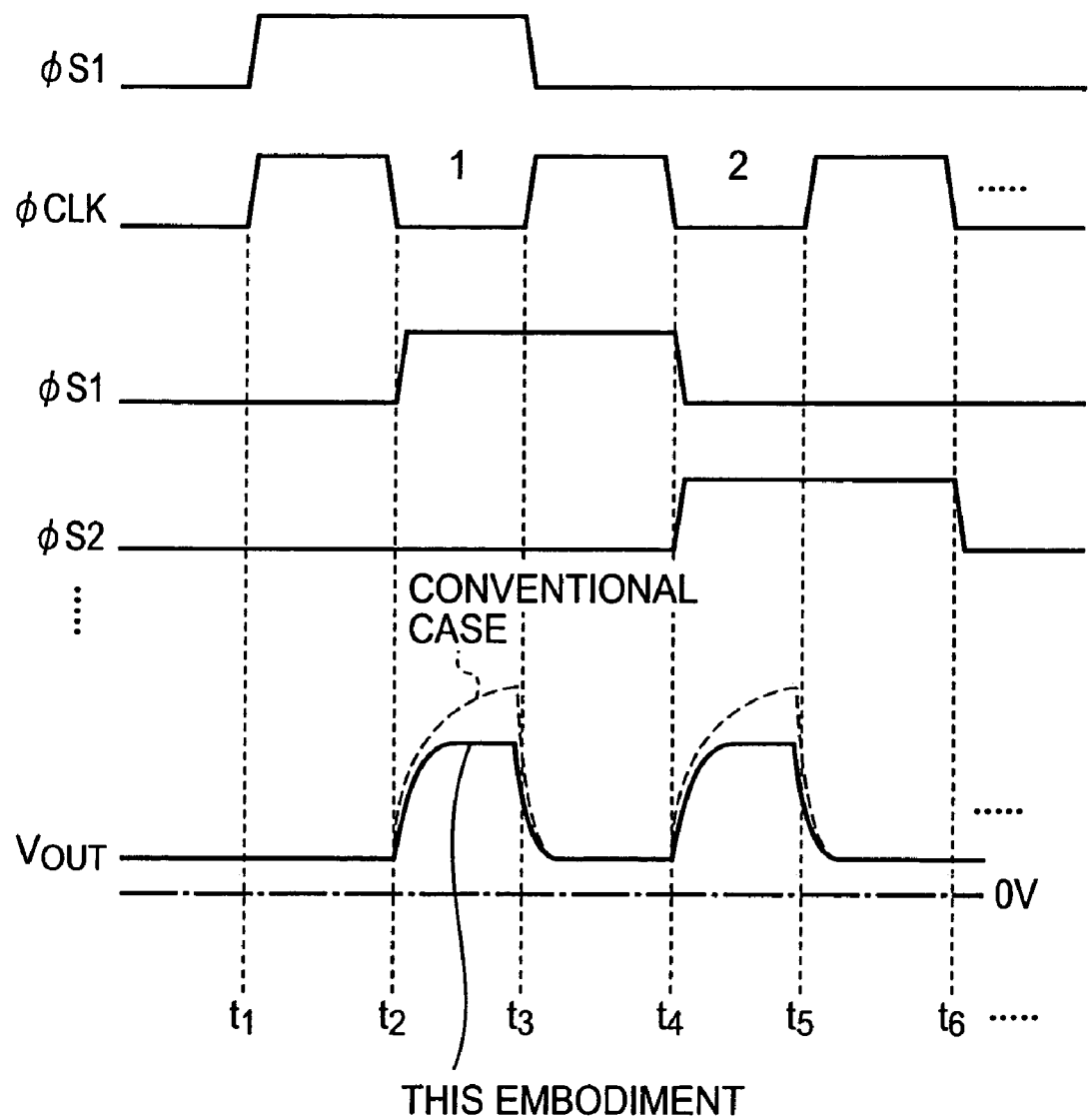
FIG. 3 is a timing chart for explaining operations of the image sensor shown in FIG. 1.

Next, a description is made of an operation example of the image sensor according to an embodiment with reference to FIG. 1 and FIG. 3. FIG. 3 is a timing chart for explaining the operation example of the image sensor of FIG. 1.

When an acquisition operation of image data is commenced with respect to a semiconductor element of the image sensor shown in FIG. 1, in order that the semiconductor element is brought into an operation enable state, a pulse ΦCS having an "H" level is supplied from a terminal (not shown). As a result, the switch 5 becomes an ON state, so the signal line 4 is electrically connected to the signal output terminal 6. Also, the signal output terminal 6 is electrically connected to the signal input terminal TAIN.

Then, at a time instant t1, an inputting operation of the pulse Φck (clock pulse) is commenced in a predetermined time period, and also, a pulse ΦSI having an "H" level is entered as data to be transferred.

As a result, both the pulse ΦSI and the pulse Φclk are inputted with respect to the scanning circuit 1. Since the level of the pulse Φclk becomes an "H" level, the switch 7 is brought into an ON state, so the signal line 4 is connected to the reference voltage line 10, and the potential at the signal line 4 is reset to the voltage VREF.

Also, since the level of the pulse Φclk becomes the "H" level, the reset and control circuit 3 connects the common output line 2 to the reference voltage line 10 so as to reset the potential at the common output line 2 to the voltage VREF.

Next, at a time instant t2, the pulse Φclk is transferred to an "L" level. At this time, the scanning circuit 1 acquires the data of the pulse ΦSI having the "H" level at a falling edge of pulse Φclk, and then, outputs the acquired data as a pulse ΦS1 having an "H" level. In other words, the scanning circuit 1 outputs the data as the pulse ΦS1 having the "H" level in synchronism with the falling edge of the pulse Φclk.

At this time, since the level of the pulse Φclk becomes an "L" level, the reset and control circuit 3 electrically separates the common output line 2 from the reference voltage line 10, and connects the common output line 2 to the signal line 4.

Also, since the level of the pulse Φclk becomes the "L" level, the switch 7 is brought into an OFF state, so the signal line 4 is electrically separated from the reference voltage line 10.

At this time, since the pulse ΦS1 having the "H" level is entered to the switch SW1, the switch SW1 is brought into an ON state. As a result, the output portion of the switch SW1 is connected to the common output line 2, so the electric charge stored in the parasitic capacitance of the photoelectric converting element A1, namely, the charged voltage is outputted as an electric signal AIN via the common output line 2 and the signal line 4 to the "+" side input terminal of the operational amplifier 19. At this time, the conditions as to whether or not light is entered to the respective photoelectric converting elements A1, A2, A3, . . . , An-1, and An are controlled by determining as to whether or not an entire surface of the photoelectric converting elements is covered by opening/closing a shutter.

At this stage, since the stored charge flows as the current, as indicated in FIG. 3 (or FIG. 2), the potential at the operational amplifier 19 starts to gradually increase.

However, the current corresponding to the resistance value of the resistor RSIG flows via the resistor RSIG with respect to the reference voltage line 10.

As a result, the potential at the "+" side input terminal of the operational amplifier 19 increases based upon a difference between the current supplied from the switch SW1 and the current which flows via the resistor RSIG.

Accordingly, although the potential at the "+" side input terminal of the operational amplifier 19 increases, the amount of the current flowing through the resistor RSIG increases along with the increase of the potential, so the increase of the potential is suppressed. Also, in accordance with such a condition that the charged electric charge decreases, the increase of the potential is decreased.

As a consequence, since the resistance value of the resistor RSIG is set in correspondence with the current supplied from the switch SW1, the waveform of the electric signal AIN can be set to the flat status, as compared with the triangular shape of the prior art for the time period during which the level of the pulse Φclk is at the "L" level, namely, for the time period during which the differential amplifier 21 outputs the output signal VOUT with respect to the circuit of the next stage thereof with respect to the "+" side input terminal of the operational amplifier 19.

In other words, since the resistor RSIG corresponding to the load resistor is employed, the width of the entire dynamic range is narrow, namely, the sensitivity is lowered. However, the upper portion of the triangle wave can be pulled down to the reference potential VREF by the load resistor so as to be flattened, so the entire S/N ratio in the acquisitions of the image signals (electric signal AIN) can be improved.

Next, at a time instant t3, when the pulse Φclk rises and then becomes an "H" level, the reset and control circuit 3 electrically separates the common output line 2 from the signal line 4, and connects the separated common output line 2 to the reference voltage line 10 so as to reset the potential at the common output line 2 to the reference voltage VREF.

Also, when the signal level of the pulse Φclk becomes the "H" level, the switch 7 similarly becomes an ON state, by which the signal line 4 is connected to the reference voltage line 10 so as to reset the potential at the signal line 4 to the reference voltage VREF.

At this time, since the signal level of the switch 7 is the "H" level, the electric charge stored in the parasitic capacitance of the photoelectric converting element A1 is discharged, so the potential at the output portion of the photoelectric converting element A1 is reset to the reference voltage VREF.

Next, at a time instant t4, the pulse Φclk is transferred to an "L" level. At this time, the scanning circuit 1 acquires the data of the pulse ΦS1 having the "H" level at a falling edge of pulse Φclk, and then, outputs the acquired data as a pulse ΦS2 having an "H" level. In other words, the scanning circuit 1 transfers the "H" level of the pulse ΦS1 to an "L" level thereof in synchronism with the falling edge of the pulse Φclk, and also, shifts the pulse ΦS1 having the "H" level (namely, data inputted as ΦS1), and then, outputs the shifted pulse as a pulse ΦS2 having an "H" level.

At this time, since the level of the pulse Φclk becomes an "L" level, the reset and control circuit 3 electrically separates the common output line 2 from the reference voltage line 10, and connects the common output line 2 to the signal line 4.

Also, since the level of the pulse Φclk becomes the "L" level, the switch 7 is brought into an OFF state, so the signal line 4 is electrically separated from the reference voltage line 10.

At this time, since the pulse ΦS2 having the "H" level is entered to the switch SW2, the switch SW2 is brought into an ON state. As a result, the output portion of the switch SW2 is connected to the common output line 2, so the electric charge stored in the parasitic capacitance of the photoelectric converting element A2, namely, the charged voltage is outputted as an electric signal AIN to the "+" side input terminal of the operational amplifier 19 via the common output line 2 and the signal line 4.

At this stage, since the stored charge flows as the current, as explained at the time instant t2, the potential at the operational amplifier 19 starts to gradually increase.

Since the subsequent operation is similar to the above-explained operation of the time instant t2, detailed explanations thereof are omitted.

As described above, every time the level of the pulse Φclk is changed from the "H" level to the "L" level, or from the "L" level to the "H" level, the scanning circuit 1 sequentially shifts the data of the pulse ΦSI, and sequentially outputs the pulses ΦS3, ΦS4, . . . , ΦSn-1, and ΦSn in the "H" levels similar to the pulses ΦS1 and ΦS2. As a result, since the pulses ΦS3, ΦS4, . . . , ΦSn-1, and ΦSn are sequentially inputted to the respective switches SW3, . . . , SWn-1, and SWn in the "H" levels, these switches SW3, . . . , SWn-1, and SWn are sequentially brought into ON states so as to connect the output portions of the photoelectric converting elements A3, . . . , An-1, and An to the common output line 2 at the corresponding timing.

Then, the differential amplifier 18 amplifies a potential difference between the reference voltage VREF and a voltage value of an electric signal AIN which is successively inputted from the switches SW3, . . . , SWn−1, and SWn, and then, outputs the amplified potential difference as an output signal VOUT.

The above-explained resistor RSIG may be manufactured by a fixed resistance value in process steps for manufacturing a semiconductor element, or as indicated in FIG. 4, the resistance value of this resistor RSIG may be alternatively formed in an adjustable manner.

Figure 4C:
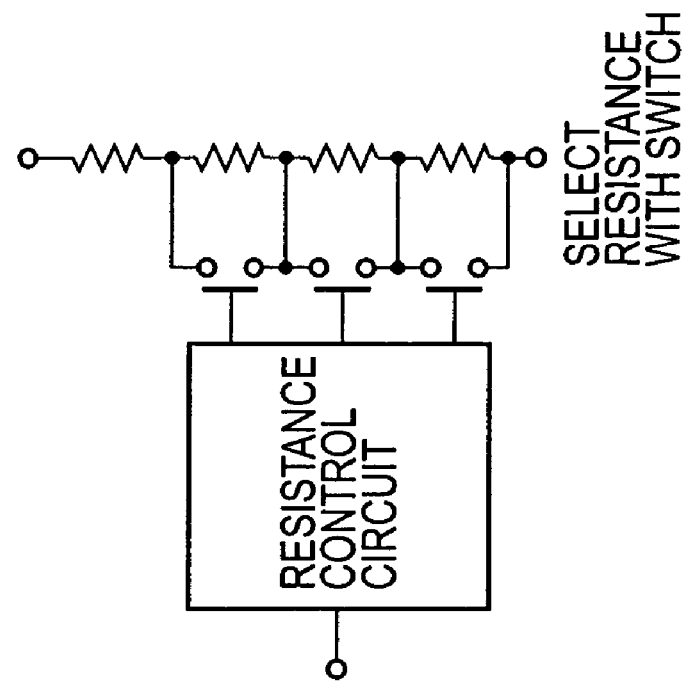
FIGS. 4A, 4B and 4C are conceptional diagrams for describing structural examples of a resistor RSIG.
Figure 4B:
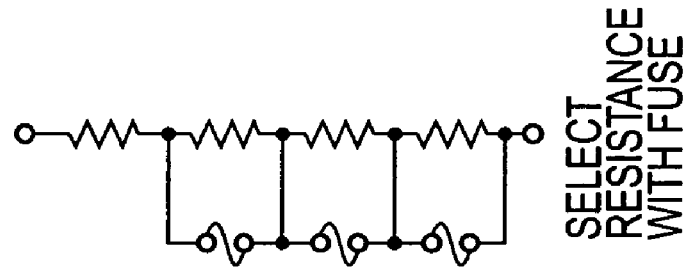
Figure 4A:
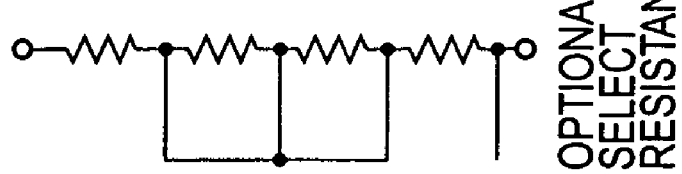

In a structure of FIG. 4A, the resistor RSIG is formed of a plurality of resistors connected in series, the resistance values of which are different from each other, or are equal to each other. In a wiring step within a plurality of process steps, both terminals of a preselected resistor are short-circuited (bypassed) by a metal mask which forms a wiring line so as to adjust resistance values to a desirable resistance value corresponding to a purpose of use. As a result, since the resistor RSIG can be manufactured in correspondence with a brightness level and an operating speed of the subject, one sort of semiconductor elements may be employed in various purposes of use, so manufacturing cost thereof can be reduced.

Next, similar to FIG. 4A, in a structure of FIG. 4B, a resistor RSIG is formed of a plurality of resistors connected in series, the resistance values of which are different from each other, or are equal to each other, while paths among the respective resistors are short-circuited by using fuses. As a consequence, in accordance with the structure of FIG. B, after each of the process steps is ended, the resistor RSIG can be adjusted to have a desirable resistance value by cutting a fuse in an arbitrary manner.

As a result, after a semiconductor element has been shipped, the resistance value of the resistor RSIG can be adjusted in correspondence with a purpose of use even by a user. Therefore, the general-purpose characteristic of this resistor RSIG can be increased as compared with that of FIG. 4A, and the metal mask is not required to be changed, so the manufacturing cost can be further reduced.

Next, similar to FIG. 4A, in a structure of FIG. 4C, a resistor RSIG is formed of a plurality of resistors connected in series, the resistance values of which are different from each other, or are equal to each other. In this example, in the structure of FIG. 4C, ON/OFF-controlled switches are provided among these resistors. That is to say, since these switches are ON/OFF-controlled, arbitrary-selected resistors are short-circuited, so the resistor RSIG can be adjusted to obtain a desirable resistance value. As shown in this drawing, a resistance value control circuit performs ON/OFF-control operations as to the respective switches by inputting thereinto such a control signal that indicates that any switch is turned ON or OFF. As a result, after a semiconductor element has been shipped, the resistance value of the resistor RSIG can be adjusted in correspondence with a purpose of use even by a user. Accordingly, the general-purpose characteristic of the resistor RSIG can be increased as compared with that of FIG. 4A, and the metal mask is not required to be changed, so the manufacturing cost can be further reduced. Moreover, when the purpose of use is changed, since the control signal is changed, the resistance value of the resistor RSIG can be re-adjusted. Accordingly, a freedom degree of the structure design shown in FIG. 4C can be improved, as compared with the structure of FIG. 4B.

Second Embodiment

Figure 5:
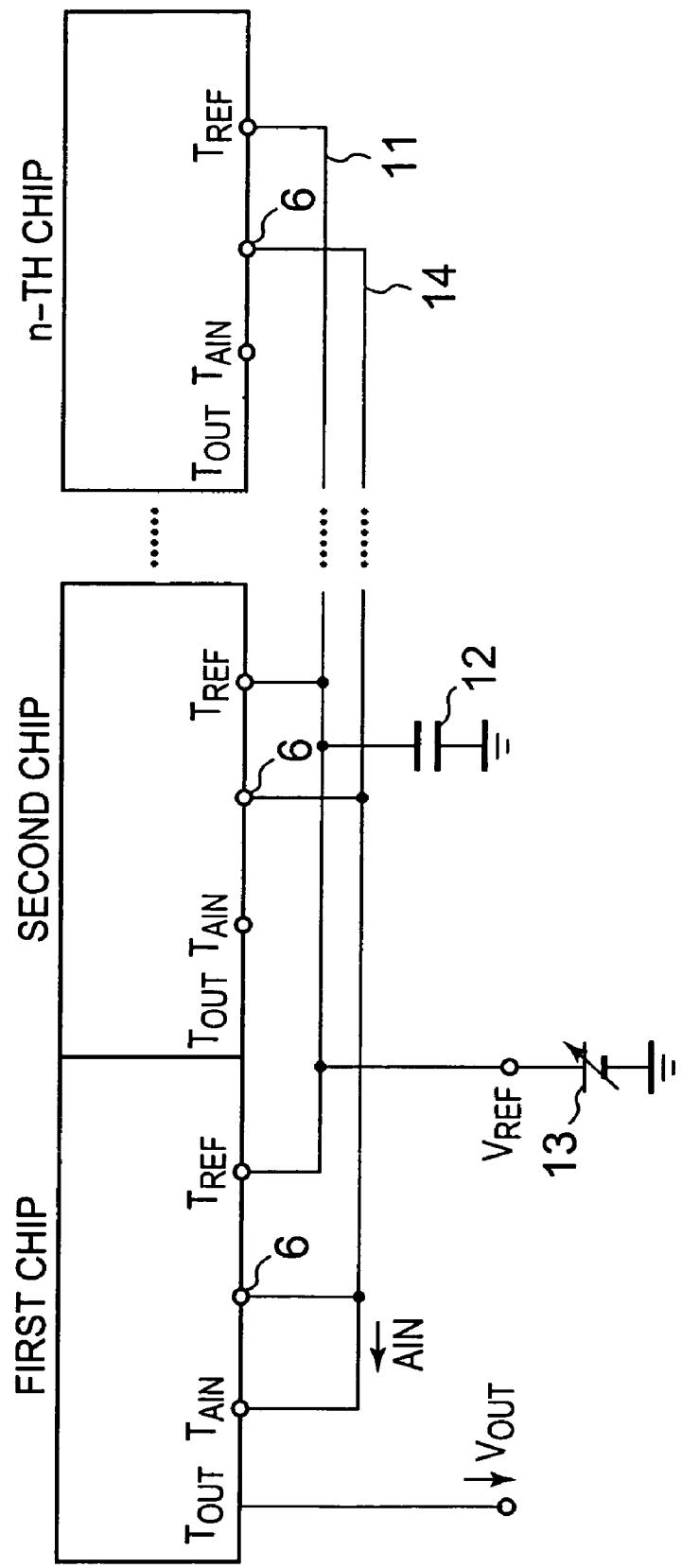
FIG. 5 is a conceptional diagram for explaining an image sensor according to a second embodiment of the present invention, which is arranged by connecting the image sensors according to the first embodiment of the present invention to each other in series.

FIG. 5 is a conceptional diagram for indicating such an arrangement that a plurality of sets of the image sensors according to the first embodiment are connected to each other in series in order to increase a number of dots for reading image information.

In this arrangement, an external terminal TSO of a first image sensor chip is connected to an external terminal TSI of a second image sensor chip, an external terminal TSO of the second image sensor chip is connected to an external terminal TSI of a third image sensor chip, . . . , an external terminal TSO of an (n−1)th image sensor chip is connected to an external terminal TSI of an nth image sensor chip. As a result, a pulse ΦSI having an "H" level which is entered to the external terminal TSO of the first image sensor chip is sequentially shifted as data from the scanning circuit 1 of the first image sensor chip, the scanning circuit 1 of the second image sensor chip, . . . , the scanning circuit 1 of the nth image sensor chip in response to a pulse clk, so data of photoelectric converting elements A1 to An of each image sensor chip (semiconductor element) are outputted from a signal output terminal 6 of each of these image sensor chips.

In the case of the arrangement shown in FIG. 5, amplifications of electric signals AIN outputted from the respective image sensor chips are carried out by employing a differential amplifier 18 of the first image sensor chip. Therefore, the signal output terminals of the first image sensor chip to the nth image sensor chip are connected to a terminal TAIN of the first image sensor chip. A chip selecting operation is carried out in such a manner that a pulse ΦCS having an "H" level is applied with respect to a image sensor chip to be used so as to activate the image sensor chip, and the common signal line 2 is connected via the signal line 4 to the signal output terminal 6, so the electric signals AIN are outputted from the respective switches SW. With employment of this arrangement, the electric signals outputted from each of these image sensor chips is inputted to the first image sensor chip, a difference between a voltage of the electric signal AIN and the reference voltage VREF is amplified by the differential amplifier 18 of the first image sensor chip, and then, the amplified signals are sequentially outputted as an output signal VOUT.

Also, to employ the reference voltage VREF, reference voltage terminals TREF of all of the image sensor chips are connected to one another, and a capacitor 12 for stabilizing the voltage is connected thereto. As a consequence, the reference voltages VREF generated from the reference voltage generating circuit 9 of each of the image sensor chips are averaged. Also, as indicated in FIG. 5, a reference voltage generating circuit 13 may be alternatively provided at an external unit.

Since internal operations of the respective image sensor chips have been explained in the first embodiment, detailed descriptions thereof are omitted.

Third Embodiment

Figure 6:
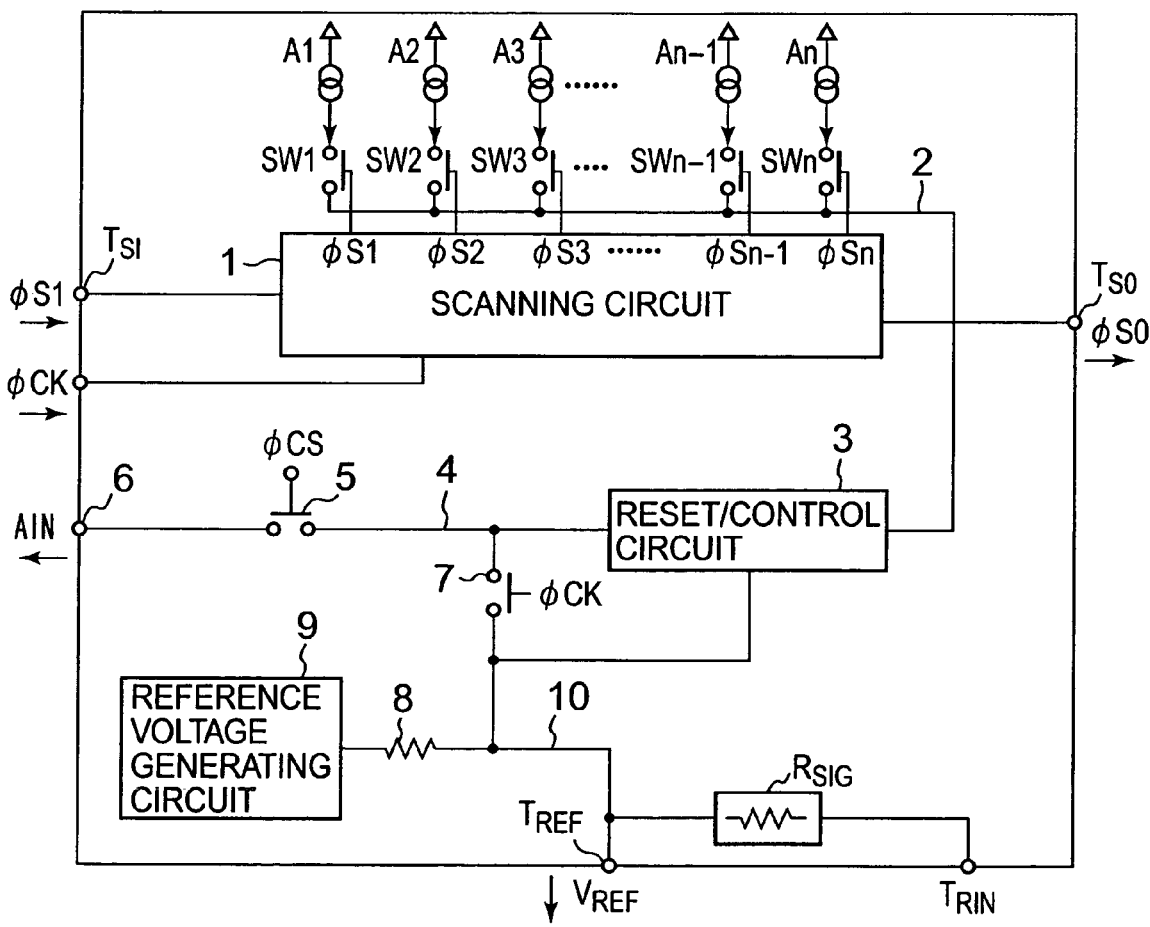
FIG. 6 is a block diagram for schematically showing a structural example of an image sensor according to a third embodiment of the present invention.
Figure 7:
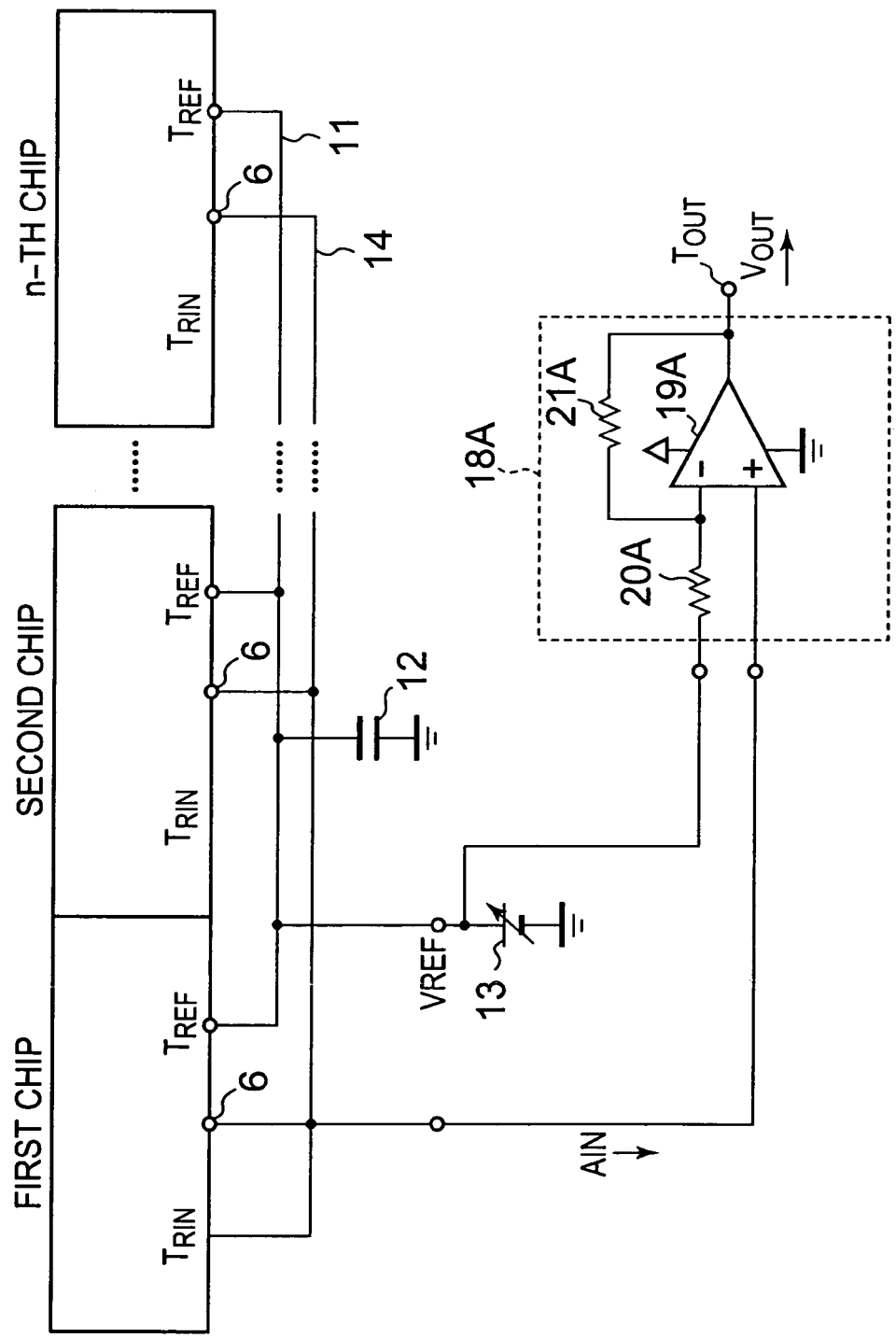
FIG. 7 is a conceptional diagram for explaining such an arrangement that the image sensors according to the third embodiment of the present invention are connected to each other in series, and used.
Figure 8:
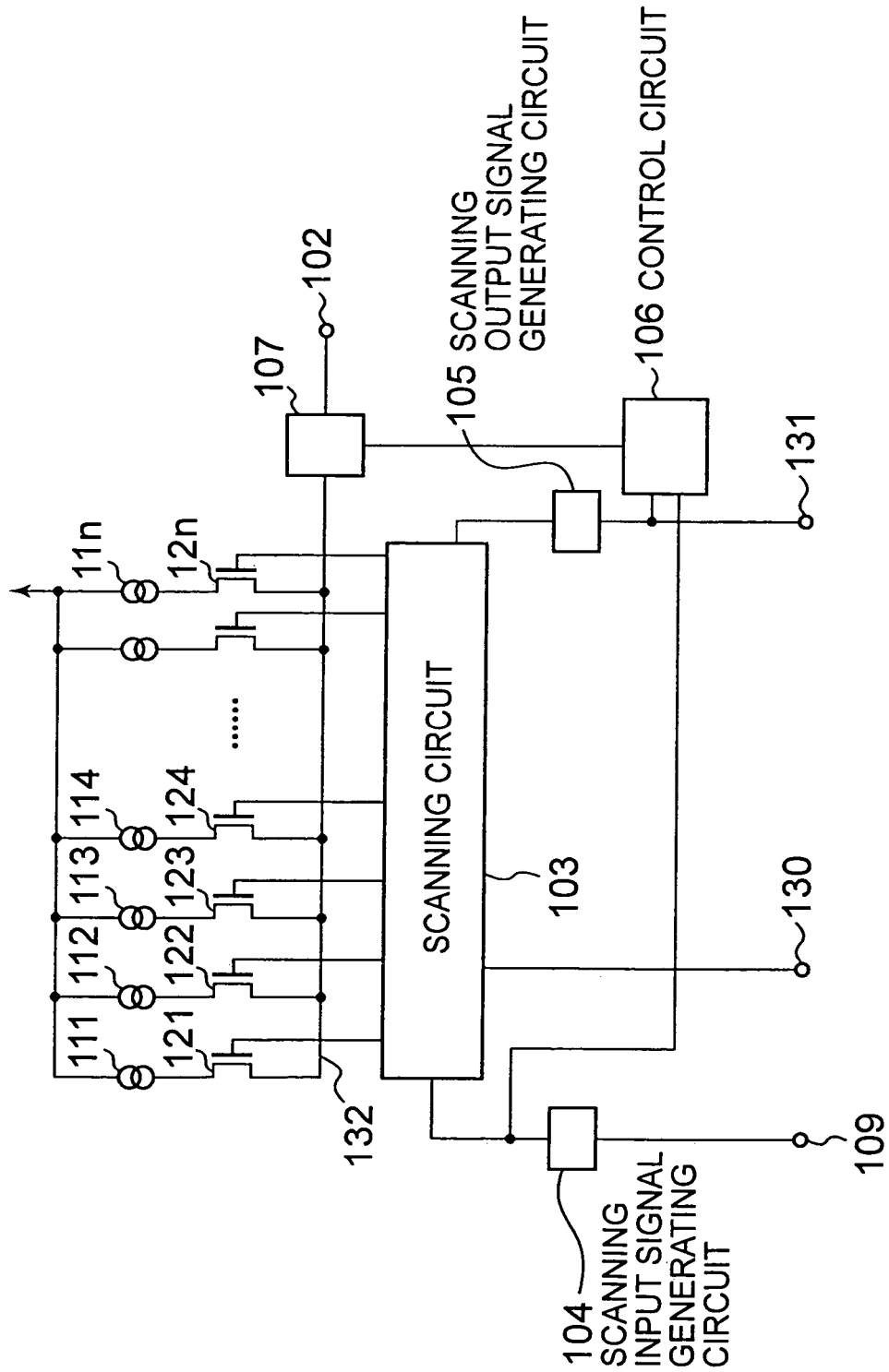
FIG. 8 is the block diagram for showing the structural example of the image sensor of the conventional technique.

As indicated in FIG. 6, in such a case that the differential amplifier 18 is not provided inside a semiconductor element, as shown in FIG. 7, a differential amplifier 18A must be provided outside the semiconductor element. Similar to the differential amplifier 18 of FIG. 1, the differential amplifier 18A is composed of an operational amplifier 19A, a resistor 20A, and another resistor 21A, while an amplification factor is set based upon resistance values of the resistor 20A and the resistor 21A.

Also, as indicated in FIG. 7, in the case where a plurality of image sensor chips are connected for use, reference voltage terminals TREF of the respective image sensor chips are connected to each other so as to average the reference voltages VREF of the respective image sensor chips, which is similar to the second embodiment. At this time, as to the resistor RSIG which is connected to a "+" side input terminal of the operational amplifier 19A, any one of the image sensor chips is employed, and in FIG. 7, a first image sensor chip is employed. As a result, in accordance with the third embodiment, the "+" side input terminal of the operational amplifier 19A is pulled down to the reference voltage VREF by employing the resistor RSIG of the first image sensor chip. As a consequence, since a common load is provided after a common line has been connected, characteristics can be hardly fluctuated among the image sensor chips, so image signals can be acquired in high precision.

In the first to third embodiments, such an arrangement has been described in which since the photoelectric converting element is illuminated by light, the photoelectric converting element stores the electric charge, and increases the voltage level of the electric signal AIN with respect to the reference voltage VREF. Alternatively, even when such an arrangement is employed in which since the photoelectric converting element is illuminated by light, the photoelectric converting element decreases the voltage level of the electric signal AIN with respect to the reference voltage VREF, the present invention may be applied thereto.

What is claimed is:

1. An image sensor, comprising:
    a plurality of photoelectric converting elements configured to photoelectrically convert inputted optical signals into electric signals having voltages corresponding to brightness levels of the inputted optical signals;
    a plurality of selection switches provided respectively for the photoelectric converting elements, the plurality of selection switches being turned ON/OFF to selectively provide the electric signals from the photoelectric converting elements to a common output line;
    a scanning circuit configured to sequentially turn ON/OFF the selection switches in response to entered pulses;
    a differential amplifier configured to amplify a voltage difference between a first input terminal and a second input terminal thereof, the first input terminal configured to receive the electric signal from the common output line, and the second input terminal configured to receive a reference voltage; and
    a resistor having one end connected to the first input terminal of the differential amplifier, the reference voltage being supplied to the other end of the resistor, wherein a voltage applied to the first input terminal is controlled by a current of the respective electric signal at least partially diverted away through the resistor to thereby curb a peak appearing in an output signal from the differential amplifier.

2. An image sensor according to claim 1, wherein a resistance value of the resistor is set in correspondence with an amount of light inputted.

3. An image sensor according to claim 1, wherein the resistor comprises a plurality of sub-resistors connected in series, and a resistance value of the resistor is adjusted by short-circuiting at least one of the sub-resistors.

4. An image sensor according to claim 1, wherein the photoelectric converting elements, the selecting switches, the differential amplifier, and the scanning circuit are integratedly formed on the same substrate.

5. A set of image sensors comprising a plurality of serially connected image sensors recited in claim 1, wherein:
    the scanning circuits of the plurality of serially connected image sensors are configured to function in concert to serially output the electric signals of the entire image sensors to a common output line; and
    the common output line is connected to the second terminal of an image sensor.

6. An image sensor according to claim 1, further comprising a reset control circuit configured to periodically reset the common output line to the reference voltage.

7. An image sensor according to claim 6, further comprising a switch configured to supply the reference voltage to the common output line to reset it at one of two alternate timings and sever the reference voltage from the common output line at the other of the two alternate timings to allow the electric signal and the reference voltage to be supplied respectively to the first and second imputer terminals of the differential amplifier.

8. A method of serially reading electrical signals from a photoelectric converter array, comprising:
    converting photo energy into electrical signals at the photoelectric converter array;
    sequentially reading out the electrical signals from the photoelectric converter array;
    supplying the electrical signals one at a time to a first input terminal of a differential amplifier at timings;
    supplying at the same timings a reference voltage to a second input terminal of the differential amplifier, so that the differential amplifier outputs an output signal at the timings according to a voltage difference between the first and second input terminals; and
    at least partially diverting away a current of the respective electrical signal to control a voltage applied to the first input terminal to thereby curb a peak appearing in the output signal from the differential amplifier.

9. A method according to claim 8, wherein a current of the respective electrical signal partially diverted away is a function of a voltage difference between the a voltage of the respective electrical signal and the reference voltage.

10. A method according to claim 8, wherein partially diverting away a current of the respective electrical signal comprises partially diverting away a current of the respective electrical signal through a resistor one end of which is supplied with the reference voltage.

11. A method according to claim 9, wherein the other end of the resistor is connected to the first input terminal.

12. A method according to claim 8, wherein the timings comprises two alternative timings, and supplying the electrical signals one at a time to the first input terminal and supplying the reference voltage to the second input terminal are performed one of the two alternate timings.

13. A method according to claim 9, further including resetting to a signal path for the electrical signals to the reference voltage at the other of the two alternate timings.

* * * * *